United States Patent
Lin et al.

(10) Patent No.: US 8,560,920 B2
(45) Date of Patent: Oct. 15, 2013

(54) ERROR CORRECTION VIA LOOKUP IN COMPRESSED ERROR LOCATION DATA

(75) Inventors: Bo Lin, East Kilbride (GB); Graham Edmiston, Glasgow (GB)

(73) Assignee: Freescale Semiconductor, Inc., Austin, TX (US)

( * ) Notice: Subject to any disclaimer, the term of this patent is extended or adjusted under 35 U.S.C. 154(b) by 1071 days.

(21) Appl. No.: 12/444,061

(22) PCT Filed: Oct. 5, 2006

(86) PCT No.: PCT/EP2006/067114
§ 371 (c)(1),
(2), (4) Date: Apr. 2, 2009

(87) PCT Pub. No.: WO2008/040393
PCT Pub. Date: Apr. 10, 2008

(65) Prior Publication Data
US 2010/0050049 A1 Feb. 25, 2010

(51) Int. Cl.
*H03M 13/00* (2006.01)
(52) U.S. Cl.
USPC .............. 714/759; 714/49; 714/701; 714/786
(58) Field of Classification Search
USPC .................. 714/49, 701, 759, 762, 786, 788
See application file for complete search history.

(56) References Cited

U.S. PATENT DOCUMENTS

| | | | | |
|---|---|---|---|---|
| 4,473,902 A | * | 9/1984 | Chen | 714/759 |
| 5,414,701 A | * | 5/1995 | Shtayer et al. | 370/395.3 |
| 5,491,700 A | * | 2/1996 | Wright et al. | 714/759 |
| 5,555,256 A | * | 9/1996 | Calamvokis | 370/399 |
| 5,761,191 A | * | 6/1998 | VanDervort et al. | 370/232 |
| 6,041,054 A | * | 3/2000 | Westberg | 370/389 |
| 6,381,245 B1 | * | 4/2002 | Hann et al. | 370/395.6 |
| 6,662,332 B1 | * | 12/2003 | Kimmitt | 714/762 |
| 7,100,020 B1 | * | 8/2006 | Brightman et al. | 712/18 |
| 7,343,542 B2 | * | 3/2008 | Lin et al. | 714/759 |
| 7,443,785 B2 | * | 10/2008 | Bloebaum | 370/216 |
| 7,546,510 B2 | * | 6/2009 | Dror et al. | 714/755 |

OTHER PUBLICATIONS

Lin; "Correcting Single-Bit Errors with CRC8 in ATM Cell Headers"; Aug. 6, 2005 www.freescale.com/files/32bit/doc/app_note/AN2918.pdf.
Tarjan et al; "Storing a sparse table"; Communications of the Association for Computing Machinery, NY, US, Nov. 1979.

* cited by examiner

*Primary Examiner* — Joseph Schell (57) ABSTRACT

An error correction apparatus comprises an input for receiving data. The received data includes error-check data. The apparatus also includes a processing resource arranged to calculate parity check data. A data store is coupled to the processing resource for storing look-up data for identifying, when in use, a location of an error in the received data. The look-up data is a compressed form of indexed error location data.

20 Claims, 4 Drawing Sheets

ERROR CORRECTION VIA LOOKUP IN COMPRESSED ERROR LOCATION DATA

FIELD OF THE INVENTION

This invention relates to an error correction apparatus of the type that, for example, employs look-up data to determine a location of an error in a bit pattern. This invention also relates to a method of correcting an error of the type that, for example, comprises looking-up data to determine a location of an error in a bit pattern. This invention further relates to a method of generating error location data of the type that, for example, is accessed to determine a location of an error in a bit pattern.

BACKGROUND OF THE INVENTION

In the field of data communications, it is known to generate error check data based upon a bit pattern to be communicated from a source point to a destination point in a communications network. As an example, a header of an Asynchronous Transfer Mode (ATM) cell to be transmitted from the source point to the destination point comprises 40 bits of data. Bits 0 to 7 of the header comprise so-called Header Error Check (HEC) data based upon bits 8 to 39 of the header, bits 8 to 39 comprising actual header data to be communicated. The HEC data is a Cyclic Redundancy Check 8 (CRC8) value calculated from the actual data (bits 8 to 39).

Upon receipt of the header, the CRC8 value of the data portion of the header (bits 8 to 39) is re-calculated and used. In the case of ATM, the calculated CRC8 value is XORed with the HEC data received to calculate parity check data, sometimes known as a syndrome value. For each bit position of the received data (bits 0 to 39), a unique syndrome value exists and is typically stored in a look-up table indexed by bit position. Hence, the unique syndrome value indicates the location of a one-bit error.

Consequently, after calculation of the syndrome value, the syndrome value is used to search the look-up table for a corresponding location (bit position) of a bit that is in error. The location of the error is then used to correct the 1-bit error that the received data contains.

However, the table is unsorted and so access of error location data is inefficient, as a linear search method is usually involved. Therefore, for reasons of access speed, the table is sorted by syndrome value and "padded" with unspecified error locations for non-existent syndrome values, for example −1. The padded look-up table is indexed by syndrome value, the error location data constituting table entries. Further, the padded look-up table is known as a "reverse table".

In order to provide the above error correction, a so-called micro-engine module is provided, supported by a microprocessor. However, the micro-engine has limited storage capacity and the padded reverse look-up table is an inefficient use of storage space. For example, a typical reverse look-up table for providing CRC8 error correction only has 40 out of 256 "specified" entries, i.e. only 15.6% of the entries are specified, the remaining entries using valuable storage capacity of the micro-engine. Consequently, use of the micro-engine module may not be possible where constraints on memory space exist.

STATEMENT OF INVENTION

According to the present invention, there is provided an error correction apparatus, a method of correcting an error and a method of generating error location data as set forth in the appended claims.

BRIEF DESCRIPTION OF THE DRAWINGS

At least one embodiment of the invention will now be described, by way of example only, with reference to the accompanying drawings, in which.

DESCRIPTION OF PREFERRED EMBODIMENTS

Throughout the following description identical reference numerals will be used to identify like parts.

Figure 1:
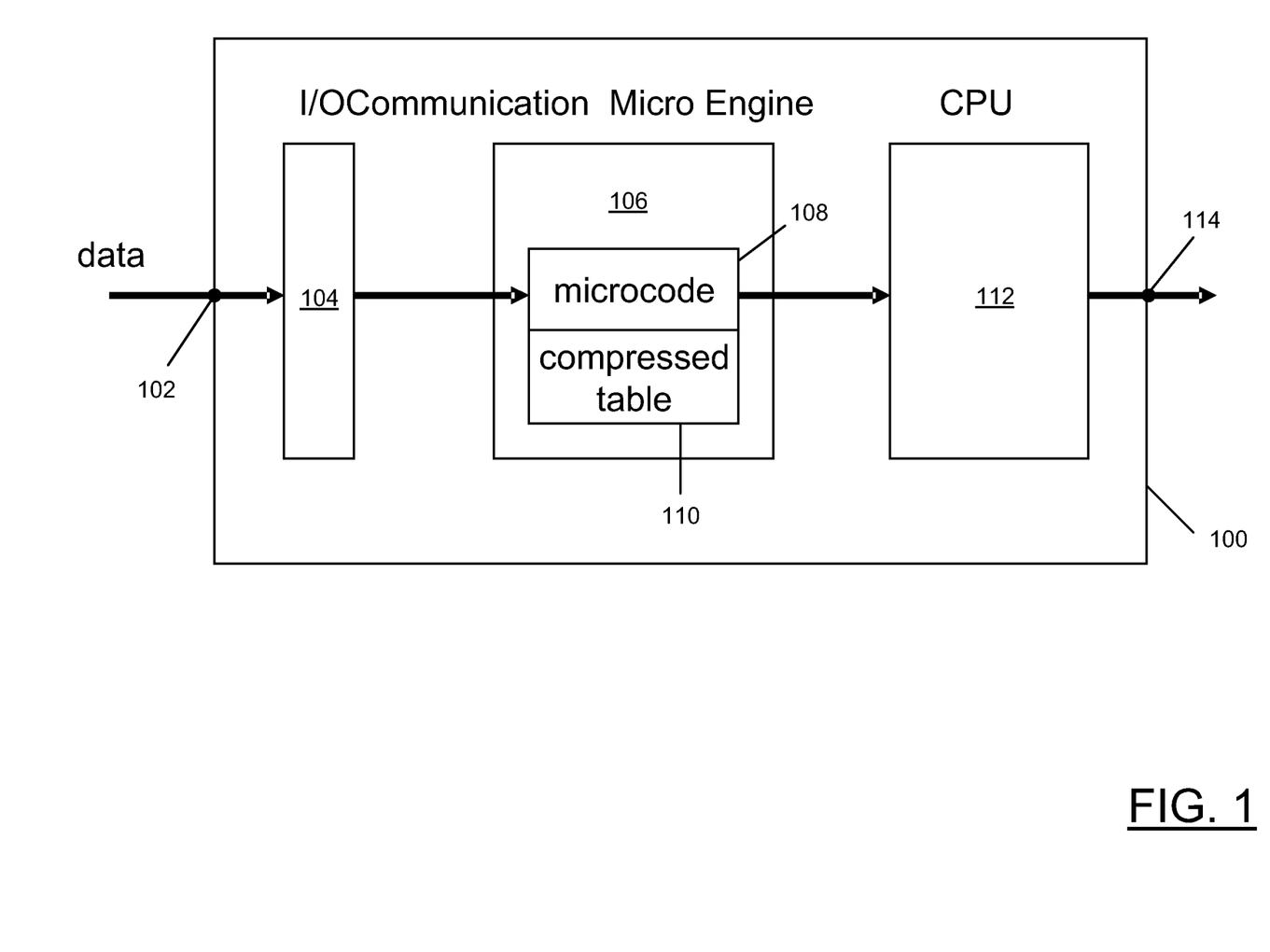
FIG. 1 is a schematic diagram of an error correction apparatus constituting an embodiment of the invention.

Referring to FIG. 1, a communications processor 100 of a Power Quad Universal Integrated Communications Controller (PowerQUICC™) available from Freescale, Inc. comprises an input 102 coupled to an interface 104, for example an analogue-to-digital converter circuit and, optionally an optical transducer circuit to convert received optical signals to the electrical domain in the event that the communications processor is coupled to an optical communications network (not shown). The interface 104 is coupled to a micro-engine circuit 106 comprising microcode 108 to be executed and a storage space 110 containing compressed look-up data. The micro-engine 106 is coupled to a Central Processing Unit (CPU) 112 of the communications processor 100, the CPU 112 being coupled to an output 114 of the communications processor 100 for coupling the communications processor 100 to, for example an Internet Protocol (IP) interface (not shown).

The compressed look-up data is formed by compressing an original padded reverse look-up table of a known type, for example the padded reverse look-up table of Table I below.

TABLE I

| Syndrome | errorLoc |
|---|---|
| 0 | −1 |
| 1 | 0 |
| 2 | 1 |
| 3 | −1 |
| 4 | 2 |
| 5 | −1 |
| 6 | −1 |
| 7 | 8 |
| 8 | 3 |
| 9 | −1 |
| 10 | −1 |
| 11 | 31 |
| 12 | −1 |
| 13 | −1 |
| 14 | 9 |
| 15 | −1 |
| 16 | 4 |
| 17 | −1 |
| 18 | −1 |
| 19 | −1 |
| 20 | −1 |
| 21 | 16 |
| 22 | 32 |
| 23 | −1 |
| 24 | −1 |
| 25 | −1 |
| 26 | −1 |
| 27 | −1 |

TABLE I-continued

| Syndrome | errorLoc |
|---|---|
| 28 | 10 |
| 29 | −1 |
| 30 | −1 |
| 31 | −1 |
| 32 | 5 |
| 33 | −1 |
| 34 | −1 |
| 35 | −1 |
| 36 | −1 |
| 37 | −1 |
| 38 | −1 |
| 39 | −1 |
| 40 | −1 |
| 41 | −1 |
| 42 | 17 |
| 43 | −1 |
| 44 | 33 |
| 45 | −1 |
| 46 | −1 |
| 47 | −1 |
| 48 | −1 |
| 49 | 39 |
| 50 | −1 |
| 51 | −1 |
| 52 | −1 |
| 53 | −1 |
| 54 | −1 |
| 55 | −1 |
| 56 | 11 |
| 57 | −1 |
| 58 | −1 |
| 59 | −1 |
| 60 | −1 |
| 61 | −1 |
| 62 | −1 |
| 63 | −1 |
| 64 | 6 |
| 65 | −1 |
| 66 | −1 |
| 67 | 29 |
| 68 | −1 |
| 69 | −1 |
| 70 | −1 |
| 71 | −1 |
| 72 | −1 |
| 73 | −1 |
| 74 | −1 |
| 75 | −1 |
| 76 | −1 |
| 77 | −1 |
| 78 | −1 |
| 79 | −1 |
| 80 | −1 |
| 81 | 27 |
| 82 | −1 |
| 83 | −1 |
| 84 | 18 |
| 85 | −1 |
| 86 | −1 |
| 87 | 20 |
| 88 | 34 |
| 89 | −1 |
| 90 | −1 |
| 91 | 22 |
| 92 | −1 |
| 93 | −1 |
| 94 | −1 |
| 95 | −1 |
| 96 | −1 |
| 97 | −1 |
| 98 | −1 |
| 99 | −1 |
| 100 | −1 |
| 101 | −1 |
| 102 | −1 |
| 103 | 36 |
| 104 | −1 |
| 105 | −1 |
| 106 | −1 |
| 107 | 24 |
| 108 | −1 |
| 109 | −1 |
| 110 | −1 |
| 111 | −1 |
| 112 | 12 |
| 113 | −1 |
| 114 | −1 |
| 115 | −1 |
| 116 | −1 |
| 117 | −1 |
| 118 | −1 |
| 119 | −1 |
| 120 | −1 |
| 121 | −1 |
| 122 | −1 |
| 123 | −1 |
| 124 | −1 |
| 125 | −1 |
| 126 | −1 |
| 127 | −1 |
| 128 | 7 |
| 129 | −1 |
| 130 | −1 |
| 131 | −1 |
| 132 | −1 |
| 133 | −1 |
| 134 | 30 |
| 135 | −1 |
| 136 | −1 |
| 137 | 15 |
| 138 | −1 |
| 139 | −1 |
| 140 | −1 |
| 141 | −1 |
| 142 | −1 |
| 143 | −1 |
| 144 | −1 |
| 145 | −1 |
| 146 | −1 |
| 147 | −1 |
| 148 | −1 |
| 149 | −1 |
| 150 | −1 |
| 151 | −1 |
| 152 | −1 |
| 153 | −1 |
| 154 | −1 |
| 155 | 38 |
| 156 | −1 |
| 157 | −1 |
| 158 | −1 |
| 159 | −1 |
| 160 | −1 |
| 161 | −1 |
| 162 | 28 |
| 163 | −1 |
| 164 | −1 |
| 165 | −1 |
| 166 | −1 |
| 167 | −1 |
| 168 | 19 |
| 169 | −1 |
| 170 | −1 |
| 171 | 26 |
| 172 | −1 |
| 173 | −1 |
| 174 | 21 |
| 175 | −1 |
| 176 | 35 |
| 177 | −1 |
| 178 | −1 |
| 179 | −1 |
| 180 | −1 |
| 181 | −1 |
| 182 | 23 |
| 183 | −1 |

TABLE I-continued

| Syndrome | errorLoc |
|---|---|
| 184 | −1 |
| 185 | −1 |
| 186 | −1 |
| 187 | −1 |
| 188 | −1 |
| 189 | −1 |
| 190 | −1 |
| 191 | −1 |
| 192 | −1 |
| 193 | −1 |
| 194 | −1 |
| 195 | −1 |
| 196 | −1 |
| 197 | −1 |
| 198 | −1 |
| 199 | 14 |
| 200 | −1 |
| 201 | −1 |
| 202 | −1 |
| 203 | −1 |
| 204 | −1 |
| 205 | −1 |
| 206 | 37 |
| 207 | −1 |
| 208 | −1 |
| 209 | −1 |
| 210 | −1 |
| 211 | −1 |
| 212 | −1 |
| 213 | −1 |
| 214 | 25 |
| 215 | −1 |
| 216 | −1 |
| 217 | −1 |
| 218 | −1 |
| 219 | −1 |
| 220 | −1 |
| 221 | −1 |
| 222 | −1 |
| 223 | −1 |
| 224 | 13 |
| 225 | −1 |
| 226 | −1 |
| 227 | −1 |
| 228 | −1 |
| 229 | −1 |
| 230 | −1 |
| 231 | −1 |
| 232 | −1 |
| 233 | −1 |
| 234 | −1 |
| 235 | −1 |
| 236 | −1 |
| 237 | −1 |
| 238 | −1 |
| 239 | −1 |
| 240 | −1 |
| 241 | −1 |
| 242 | −1 |
| 243 | −1 |
| 244 | −1 |
| 245 | −1 |
| 246 | −1 |
| 247 | −1 |
| 248 | −1 |
| 249 | −1 |
| 250 | −1 |
| 251 | −1 |
| 252 | −1 |
| 253 | −1 |
| 254 | −1 |
| 255 | −1 |

Figure 2:
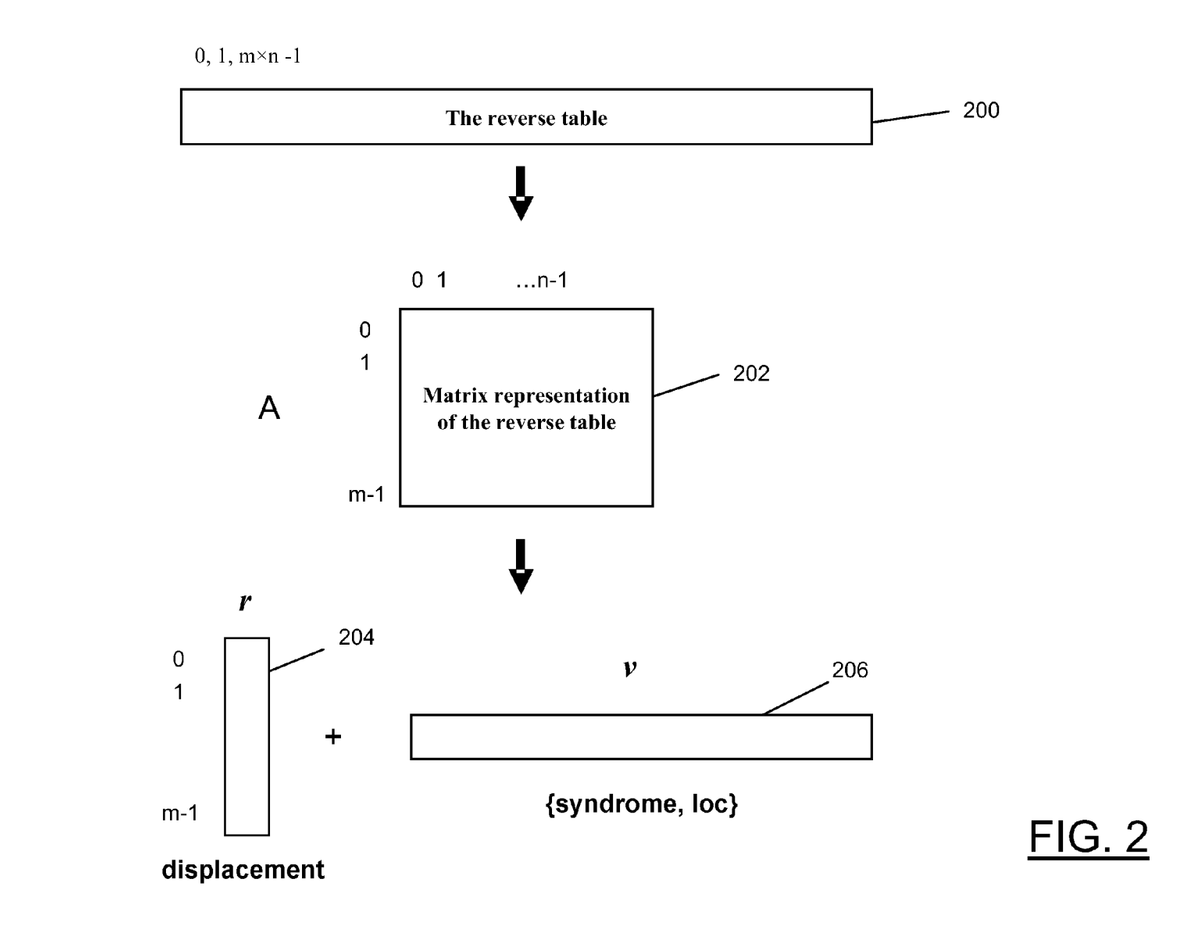
FIG. 2 is a schematic diagram of a data compression technique.

Turning to FIG. 2, the original padded reverse look-up table 200 is transformed to a matrix 202, for example a square matrix, such as a 16×16 matrix. The matrix 202 is then compressed into a first array of data 204 and a second array of data 206, the first array of data 204 being a displacement array, r, and the second array of data 206 comprising a plurality of vectors, each vector being two-dimensional. The matrix 202 is compressed according to any suitable algorithm, for example, as described in "Storing a Sparse Table" (Robert Endre Tarjan, Andrew Chi-Chih Yoo, Communications of the ACM, November 1979, Volume 22, Number 11).

The compression technique is such that a mapping exists between the first array of data 204 and the second array of data 206. Examples of the first array of data 204 and the second array of data 206 are shown in Tables II and III below (use of the term "Table" is not intended to be limiting and purely for identification purposes), respectively.

TABLE II

| | |
|---|---|
| 0 | 0 |
| 1 | 17 |
| 2 | 20 |
| 3 | 34 |
| 4 | 36 |
| 5 | 2 |
| 6 | 27 |
| 7 | 5 |
| 8 | 19 |
| 9 | 5 |
| 10 | 10 |
| 11 | 31 |
| 12 | 19 |
| 13 | 9 |
| 14 | 0 |
| 15 | 0 |

TABLE III

| |
|---|
| {224, 13} |
| {1, 0} |
| {2, 1} |
| {81, 27} |
| {4, 2} |
| {112, 12} |
| {84, 18} |
| {7, 8} |
| {8, 3} |
| {87, 20} |
| {88, 34} |
| {11, 31} |
| {162, 28} |
| {91, 22} |
| {14, 9} |
| {214, 25} |
| {155, 38} |
| {16, 4} |
| {168, 19} |
| {128, 7} |
| {32, 5} |
| {171, 26} |
| {21, 16} |
| {22, 32} |
| {174, 21} |
| {134, 30} |
| {199, 14} |
| {0, −1} |
| {137, 15} |
| {28, 10} |
| {42, 17} |
| {176, 35} |
| {44, 33} |
| {206, 37} |
| {103, 36} |
| {49, 39} |
| {64 6} |
| {182, 23} |
| {107, 24} |
| {67, 29} |
| {0, −1} |

TABLE III-continued

{0, −1}
{56, 11}
{0, −1}
{0, −1}
{0, −1}
{0, −1}
{0, −1}
{0, −1}
{0, −1}
{0, −1}
{0, −1}

Operation of the above apparatus will now be described in the context of a numerical example. In operation, the communications processor 100 receives a bit pattern 300 (FIG. 3) comprising a data portion 302 and a HEC portion 304, the bit pattern 300 being a header of an ATM cell. As transmitted, the data portion 302 was 0x30313233 and the HEC portion 304 was 0x69. Upon receipt, the data portion 302 was 0x31313233 and the HEC portion was 0x69. Hence, the data portion 302, as received, comprises a 1-bit error as compared with the data portion 302 as transmitted.

Figure 3:
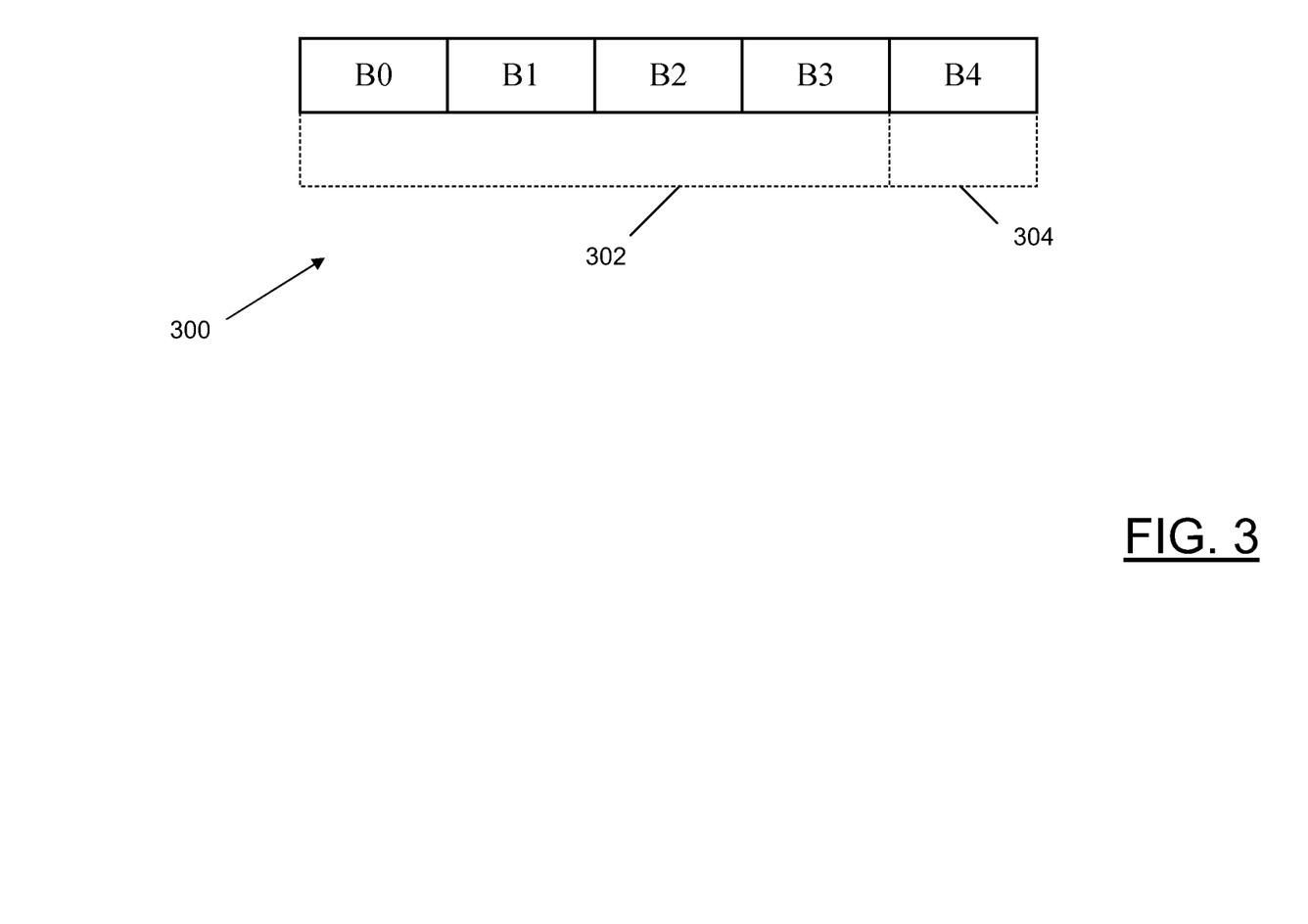
FIG. 3 is a schematic diagram of a data structure associated with data processed by the apparatus of FIG. 1.
Figure 4:
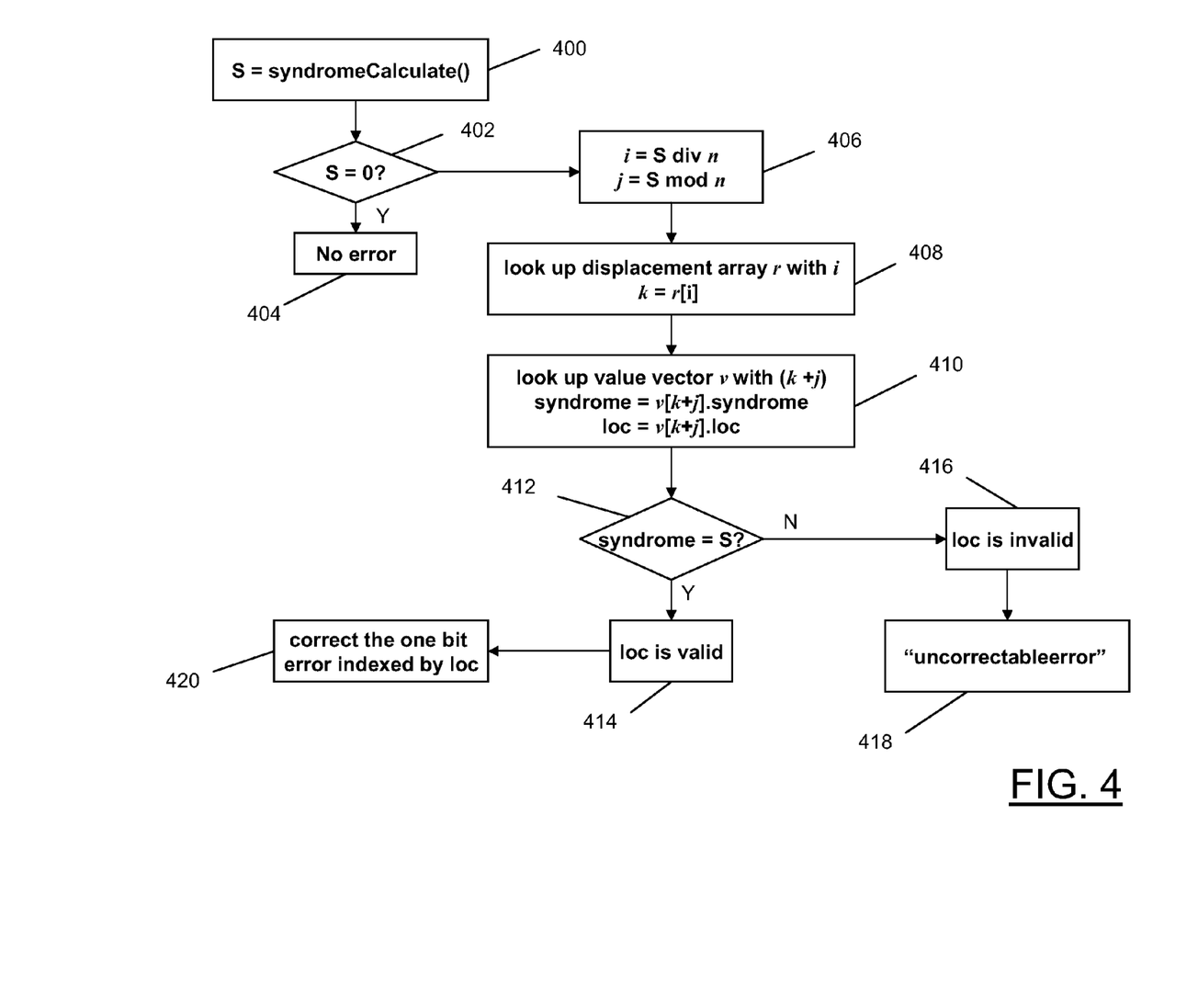
FIG. 4 is a flow diagram of a method of correcting an error for the apparatus of FIG. 1.

Referring to FIG. 4, in order to calculate a syndrome value (Step 400), the micro-engine 106 firstly calculates a verifying HEC value for the data portion 302 of the bit pattern 300 as received:

verHEC=CRC8(0x31313233)=0x7F

As can be seen from the above calculation, the verifying HEC is calculated using CRC8, though the skilled person will appreciate that other techniques can be employed for other applications, for example CRC16 or CRC32.

Using module 2 addition of the HEC as received and the calculated verifying HEC, the syndrome value is calculated (Step 400):

S=verHEC⊕rxHEC=0x7F⊕0x69=0x16=22

The micro-engine 106 then determines (Step 402) whether the calculated syndrome value is equal to zero. If the syndrome value is zero, the micro-engine determines (Step 404) that the data portion 302 of the received bit pattern 300 is correct and so the bit pattern is transferred to the CPU 112.

However, if the syndrome value is non-zero, access to the compressed look-up data is required as the non-zero nature of the calculated syndrome value is indicative of the bit pattern 300 as received containing one or more error. In accordance with the mappings convention between the first array of data 204 and the second array of data 206, an entry, i, of the first array of data 204 is identified (Step 406) by performing a division operation by n, in this example 16, of the syndrome value in order to obtain the quotient of the division for use as the entry, i, of the first array of data 204. The micro-engine 106 then calculates (Step 406) the remainder, j, of the division of the syndrome value by n, in this example 16.

The $i^{th}$ entry in the first array of data 204 is then accessed (Step 408) by the micro-engine 106 to obtain a corresponding stored displacement value, namely 17, and added to the remainder, j, calculated, namely 6:

r[i]=17 j=6 r[i]+j=17+6=23

In accordance with the mapping scheme between the first and second data arrays 204, 206, the result of the above addition identifies an entry in the second array of data 206 (Step 410), namely entry number 23 that is deemed to contain location data identifying the location in the bit pattern 300 of the error, provided the following test is satisfied.

In this regard, the $23^{rd}$ entry of the second array of data 204 is a vector containing a look-up syndrome value and corresponding location data. The look-up syndrome value is compared (Step 412) with the calculated syndrome value. If the look-up syndrome value stored is the same as the syndrome value calculated, then the syndrome value calculated is deemed (Step 414) specified in the original look-up table 200 upon which the first and second arrays of data 204, 206 are based and so the location data, in this example 32, is used. If, however, the look-up syndrome value and the calculated syndrome values are not the same, then the syndrome value calculated is deemed (Step 416) unspecified in the original look-up table 200 and the error in the bit pattern 300 cannot be corrected (Step 418) by the micro-engine 106, for example due to the bit pattern 300 containing more than one error When the calculated syndrome value is deemed (Step 414) specified, the error location in bit pattern 300 is found. If the one bit error occurs in the HEC portion 304, the data portion 302 is error free and so no error correction to the data portion 302 is needed. If the one bit-error occurs in the data portion 302, a correcting bit pattern needs be generated to correct (Step 420) the error. Consequently, a least significant bit of the following initial bit pattern is then shifted to the right by (32 (the location of the error)−8) bit positions (due to the first 8 bits of the header relating to the HEC) in order to yield a correcting bit pattern:

errorPattern=0x00000001<<(32−8)=0x01000000

The micro-engine 106 then performs module 2 addition of the data portion 302 as received with the correcting bit pattern:

rxData=0x31313233⊕0x01000000=0x30313133

The 1-bit error in the received bit pattern is thus corrected and then forwarded to the CPU 112. The above process is then repeated for subsequently received ATM headers.

Although the above example has been described in the context of an ATM header, the skilled person will appreciate that the above technique can be applied to other bit patterns, for example an IP packet.

It is thus possible to provide a method and apparatus that can facilitate access of error location data with sufficient speed whilst employing look-up data that is economic with storage space of the micro-engine. In this respect, the compressed look-up data only requires 120 bytes of storage space, representing a 53% saving in storage space over the original padded look-up table. Of course, the above advantages are exemplary, and these or other advantages may be achieved by the invention.

The invention may also be implemented in a computer program for running on a computer system, at least including code portions for performing steps of a method according to the invention when run on a programmable apparatus, such as a computer system or enabling a programmable apparatus to perform functions of a device or system according to the invention. Such a computer program may be provided on a data carrier, such as a CD-rom or diskette, stored with data loadable in a memory of a computer system, the data representing the computer program. The data carrier may further be a data connection, such as a telephone cable or a wireless connection.

In the foregoing specification, the invention has been described with reference to specific examples of embodiments of the invention. It will, however, be evident that various modifications and changes may be made therein without departing from the broader spirit and scope of the invention as set forth in the appended claims. For example, the invention is not limited to physical devices or units implemented in non-programmable hardware but can also be applied in programmable devices or units able to perform the desired device functions by operating in accordance with suitable program code. Furthermore, the devices may be physically distributed over a number of apparatuses, while functionally operating as a single device. Also, devices functionally forming separate devices may be integrated in a single physical device. Further, the skilled person will appreciate that not all advantages stated above are necessarily achieved by embodiments described herein.

In the claims, any reference signs placed between parentheses shall not be construed as limiting the claim. The word 'comprising' does not exclude the presence of other elements or steps then those listed in a claim. Furthermore, the words 'a' and 'an' shall not be construed as limited to 'only one', but instead are used to mean 'at least one', and do not exclude a plurality. The mere fact that certain measures are recited in mutually different claims does not indicate that a combination of these measures cannot be used to advantage.

The invention claimed is:

1. An error correction apparatus comprising:
   an input for receiving data that includes error-check data;
   a processing resource arranged to calculate parity check data; and
   a data store coupled to the processing resource and arranged to store look-up data for identifying, when in use, a location of an error in the received data, wherein:
      the look-up data is a compressed form of indexed error location data; and
      the processing resource is arranged to determine locations of entries in the look-up data based upon parity check calculations and to verify that values of the entries correspond to the parity check calculations.

2. An apparatus as claimed in claim 1, wherein the compressed form of the indexed error location data consists of a first array of data and a second array of data.

3. An apparatus as claimed in claim 2, wherein the second array of data comprises a plurality of vectors.

4. An apparatus as claimed in claim 3, wherein:
   a first dimension of each vector of the second array constitutes an index and a second dimension of each vector of the second array identifies an error location; and
   the verifying that values of the entries correspond to the parity check calculations comprises verifying that an index of a vector corresponds to a parity check calculation, wherein a location of an entry of the vector was determined based upon the parity check calculation.

5. The apparatus of claim 4, wherein verifying that the index of the vector corresponds to the parity check calculation comprises verifying that the index of the vector equals the parity check calculation.

6. An apparatus as claimed in claim 2, wherein:
   the first array of data comprises identifying data to identify data within the second array of data to be accessed; and
   the processing resource is arranged to use an index value to determine a first value in the first array of data and to use the index value and the first value to determine a second value in the second array of data.

7. The apparatus as claimed in claim 6, wherein:
   the index value comprises a number; and
   using the index value to determine a first value in the first array of data comprises calculating the quotient of the index value by another number.

8. The apparatus as claimed in claim 7, wherein:
   using the index value to determine a second value in the second array of data comprises calculating the remainder of the division of the index value by the other number.

9. The apparatus of claim 1, wherein:
   a location of an entry in the look-up data is determined by a plurality of values of parity check calculations;
   a value of the entry corresponds to one of the values of parity check calculations; and
   the verifying that the value of the entry corresponds to a parity check calculation value used to determine the location of the entry comprises verifying that the one value of parity check calculations corresponds to the parity check calculation value.

10. An apparatus as claimed in claim 1, wherein the compressed form of the indexed error location data is a compression of a matrix representation of a table of the indexed error location data.

11. An apparatus as claimed in claim 1, wherein the compressed form of the indexed error location data is formed using a matrix compression algorithm.

12. An apparatus as claimed in claim 1, wherein the received data is a header of a data structure.

13. An apparatus as claimed in claim 1, wherein the received data is a part of an Asynchronous Transfer Mode cell.

14. A method of correcting an error in data that includes error-check data, the method comprising the steps of:
   receiving data comprising error-check data;
   generating parity check data from the data;
   accessing look-up data to identify a location of an error in the data, the accessing comprising determining a location of an entry of the look-up data based upon the parity check data, wherein access of the look-up data comprises access of a compressed form of indexed error location data; and
   verifying that a value of the entry of the look-up data corresponds to the parity check data.

15. A method of generating error location data, the method comprising the steps of:
   generating a table of error location data indexed by parity check value;
   forming a matrix from the table of error location data; and
   compressing the matrix to form a first array of data and a second array of data, wherein:
      each entry of the second array of data comprises an error location value and a parity check value; and
      the parity check value of an entry is to be used to verify that the error location value of the entry corresponds to a parity check value used as an index to the entry.

16. A method as claimed in claim 15, wherein a mapping exists between the table of error location data and the first array of data and the second array of data.

17. A method as claimed in claim 15 wherein the second array of data comprises a plurality of vectors.

18. A method as claimed in claim 17, wherein a first dimension of each vector constitutes an index and a second dimension of each vector identifies as error location.

19. A method as claimed in claim 15, wherein the matrix is compressed using a matrix compression algorithm to form the first array of data and the second array of data.

20. A non-transitory computer-readable storage medium comprising computer program product, including program code portions for performing operations when run on a programmable apparatus, the operations comprising:
   receiving data comprising error-check data;

generating parity check data from the data;
accessing look-up data to identify a location of an error in the data, the accessing comprising determining a location of an entry of the look-up data based upon the parity check data, wherein
access of the look-up data comprises access of a compressed form of indexed error location data; and verifying that a value of the entry corresponds to the parity check data.

* * * * *